United States Patent [19]

Wargo

[11] Patent Number: 4,467,860
[45] Date of Patent: Aug. 28, 1984

[54] DEVICE FOR COOLING SEMI-CONDUCTORS

[76] Inventor: Alec Wargo, 1058 Rubber Ave., Naugatuck, Conn. 06770

[21] Appl. No.: 384,631

[22] Filed: Jun. 3, 1982

[51] Int. Cl.³ .............................................. H01L 23/46
[52] U.S. Cl. .................................. 165/80 C; 165/170; 357/82
[58] Field of Search ................ 122/6 B; 165/166, 167, 165/80 C, 80 E, 170; 357/82

[56] References Cited

U.S. PATENT DOCUMENTS

| | | | |
|---|---|---|---|
| 1,275,492 | 8/1918 | Sterzing | 165/166 |
| 3,209,640 | 10/1965 | Waivers | 165/80 E |
| 3,400,543 | 9/1968 | Ross | 165/80 C |
| 3,524,497 | 8/1970 | Chu et al. | 165/80 C |
| 4,151,548 | 4/1979 | Klein et al. | 165/80 C |
| 4,188,996 | 2/1980 | Pellant et al. | 165/80 C |
| 4,366,497 | 12/1982 | Block et al. | 165/80 C |

FOREIGN PATENT DOCUMENTS 1306224  2/1973  United Kingdom .............. 165/80 C

*Primary Examiner*—Sheldon J. Richter
*Attorney, Agent, or Firm*—Bachman and LaPointe

[57] ABSTRACT

Device for cooling semi-conductors wherein the cooler has an external surface for bearing against the cooled element. The cooler is characterized by an internal chamber having a plurality of spaced apart cooling studs.

9 Claims, 4 Drawing Figures

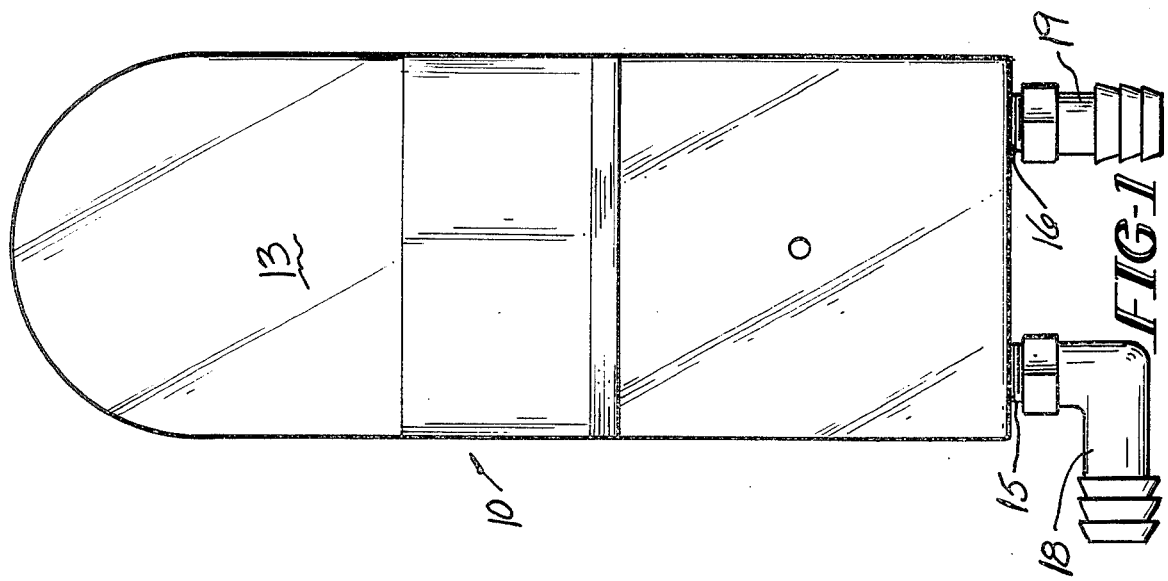
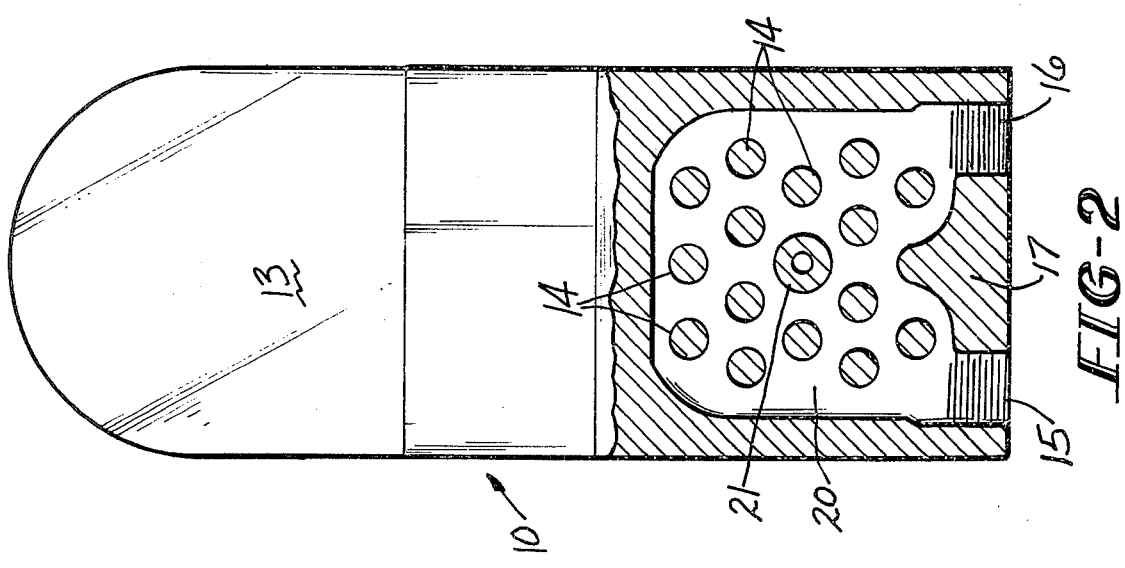
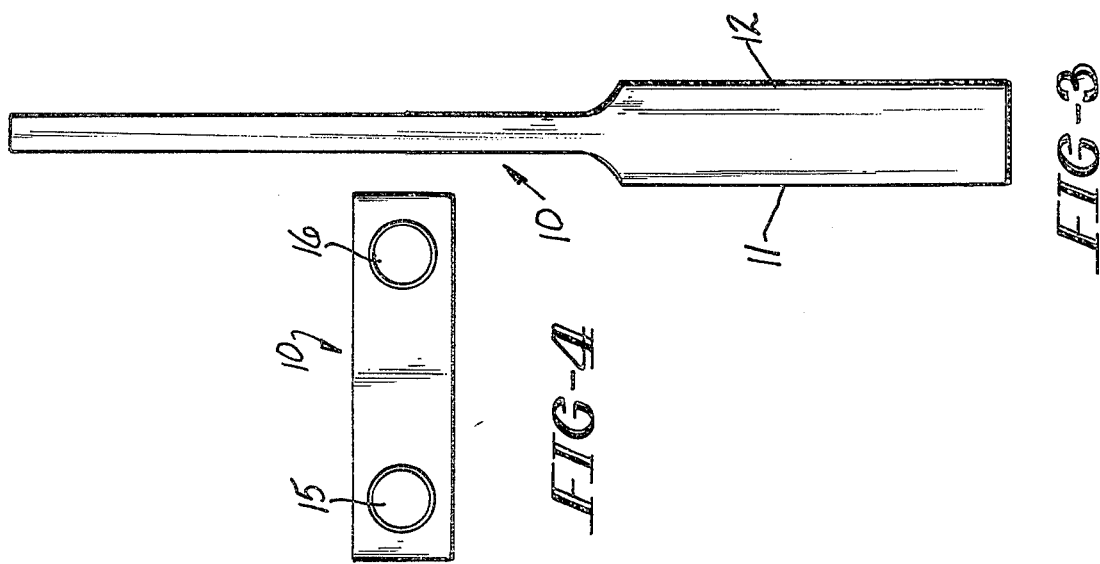
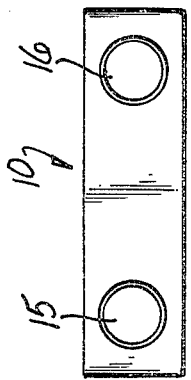

DEVICE FOR COOLING SEMI-CONDUCTORS

BACKGROUND OF THE INVENTION

This invention deals with the art of coolers especially for cooling high power semi-conductors.

A variety of types of heat sink members are known for cooling semi-conductor power elements. However, because of the practical problems involved, conventional commercial techniques often involve the use of a relatively thick and hence inefficient hollow heat sink member. The semi-conductor devices may be stacked between such members, and the heat sink normally connected by dielectric tubing to the coolant source. The heat sink members often have machined complex or convoluted passageways therein which involve increased cost and complex material preparation procedures.

Other problems exist in conventional practice. For example, the coolant flow passages in the heat sink member are desirably made as narrow as possible to make the member as thin as possible. Coolant must be circulated through the heat sink at a high rate of flow and the components must be able to withstand a high pressure without leaking.

Also, known coolers may be designed with straight liquid conducting channels, mainly because of their simple manufacturing technology. Such coolers are usually formed of material having a good heat conductivity, such as copper. However, laminar layers are formed on the walls of such straight channels, thereby reducing the heat transfer from the body of the cooler of the cooling medium. There are also known arrangements wherein a circular plate with radial grooves is fitted on at least one side thereof to a flat connecting piece provided with concentric grooves for the supply of cooling liquid. These arrangements are simple from a technical standpoint; however, because of insufficient turbulence of the cooling liquid during its passage through the cooler, they do not provide the required cooling effect.

Fabricated, multi-piece coolers having machined passages are known; however, the machining operation is quite expensive and also requires extensive soldering or bonding operations making them prone to leaks. Casting operations are less expensive and are quite desirable, but have shown heat exchange defects.

SUMMARY OF THE INVENTION

It is therefore an object of the present invention to provide an efficient cooler for use with semi-conductor power elements.

It is a particular object of the present invention to provide a cooler as aforesaid which is convenient and inexpensive to manufacture and which is versatile in its operation.

Other objects and advantages of the present invention will appear hereinbelow.

In accordance with the present invention the foregoing objects and advantages may be readily obtained.

The present invention resides in a cooler for use with semi-conductor power elements which comprises: a one-piece metal casting having an essentially planar external surface and an internal cooling chamber for receiving a cooling medium, inlet and outlet means communicating with said chamber, and a plurality of cooling pins within said chamber, wherein said pins are spaced 0.15 to 0.3" from each other.

The cooler of the present invention is surprisingly efficient, as will be clearly shown in the ensuing specification. The fact that the cooler is a one-piece casting represents a considerable advantage since this is a simple and expeditious operation and, for example, avoids the high cost and inconvenience of fabricated machining operations. Also, the one-piece casting eliminates potential leaks. The pin placement and cooler characteristics are designed for efficient performance. Indeed, the performance characteristics of the cooler of the present invention are quite surprising.

BRIEF DESCRIPTION OF THE DRAWINGS

An illustrative embodiment of the cooler of the present invention is illustrated in the attached drawings in which:

FIG. 1 is a top view of an illustrative cooler of the present invention with inlet and outlet fittings attached;

FIG. 2 is a top view of the cooler of FIG. 1 without the inlet and outlet fittings attached and with the internal cooling chamber cut away;

FIG. 3 is a side view of the cooler of FIG. 2; and

FIG. 4 is an end view of the cooler of FIG. 2.

DESCRIPTION OF THE PREFERRED EMBODIMENT

In accordance with the present invention, the cooler is a one-piece metal casting 10 having an essentially planar external surface and preferably an essentially planar external upper surface 11 and an essentially planar lower surface 12 for bearing against one or two elements to be cooled. In the embodiment shown, the cooler has a laterally extending wing element 13 which is optional and which is intended for appropriate electrical connections or the like.

The cooling element of the present invention has an internal cooling chamber 20 shown clearly in FIG. 2 for receiving a cooling medium wherein the cooling chamber contains a plurality of cooling pins 14 within said chamber. Inlet means 15 and outlet means 16 are provided communicating with said chamber for ingress of coolant, which if desired may be threaded. The inlet and outlet means 15 and 16 are preferably spaced from each other on the same side of the cooler as shown in the drawings; however, other placement means may be employed. Baffle means 17 is preferably provided between said inlet and outlet means to prevent direct flow from inlet to outlet in order to insure complete circulation of the cooling medium and to increase coolant turbulence. Conventional attachments 18 and 19 are provided communicating with the inlet and outlet, respectively, for coolant flow leading to coolant supply and treatment locations in the conventional manner. As shown in FIG. 1, it is an advantage of the present invention that straight coolant supply attachments such as shown by reference numeral 19 may be provided, or angled coolant attachments may be provided, especially at the right angle attachment shown by reference numeral 18. Thus, the cooler of the present invention offers versatility in type of attachments which may be provided.

As indicated hereinabove, it is a particular advantage of the cooler of the present invention that the cooler is made in a one-piece casting. Also, the characteristics of the cooler of the present invention are particularly designed for efficient performance, with the performance of the cooler of the present invention being particularly surprising when compared with conventional devices.

As indicated hereinabove, the cooler of the present invention preferably has an essentially planar external upper surface 11 and an essentially planar external lower surface 12 with the cooling chamber 20 being located therebetween. The wall thickness adjacent the cooling chamber in accordance with the present invention has a thickness range from 0.1 to 0.150". Generally, one desired a thinner wall thickness for better heat transfer; however, too thin a wall thickness will provide poorer electrical conductivity. Also, the wall thickness must withstand erosion, corrosion and electrolysis over time, as well as mounting forces.

The pin placement in the cooling chamber is provided so that the pins are from 0.15 to 0.3" from each other and preferably to provide a tortuous path and turbulent flow for coolant. If the pins are too close to each other, the cooling chamber will readily foul, the casting process becomes quite difficult and the resultant unit will exhibit an unacceptably high pressure drop. If the pins are too far apart, insufficient turbulence and velocity is provided of the coolant in the cooling chamber and poor fill factor will result. Naturally, the number of pins in the cooling chamber will depend on the size in the cooling chamber; however, generally, from 5 to 25 pins are provided.

The pins are preferably round in cross section and have a diameter of from 0.15 to 0.3". The considerations in pin diameter are naturally heat transfer characteristics, a desirability for a larger number of pins in a given area, the factors of erosion resistance, corrosion resistance and resistance to electrolysis and finally the fact that the cooler of the present invention is clamped under pressure so that the pins must support the adjacent walls.

Baffle 17 is preferred, although not essential. The baffle creates additional turbulence in the cooling chamber and eliminates short circuiting. It is naturally desirable for the coolant to circulate throughout the cooling chamber.

In accordance with the environment of use of the present invention, the typical range of use is a flow rate of from about ½ to about 4 gallons of coolant per minute and possibly up to 5 gallons per minute. At the higher flow rates, erosion-corrosion tends to be a problem depending of course, for example, upon the particular materials and fluids employed. At the lower flow rates, the baffle solves the short circuiting problem, creates added turbulence and improves the fill factor in the coolant loop of the present invention. The baffle is particularly useful where water is used as a coolant, and is less useful where oil is used as a coolant since the oil is more viscous and would fill the cooling chamber more readily. Alternatively, other fluids may readily be used, such as gases including freon or other liquids.

Cooling chamber 20 generally has a thickness of from 0.25 to 0.4", that is, the distance between the internal upper wall surface and the internal lower wall surface. The considerations in determining the size of the cooling chamber include the desirability to avoid too large a chamber in order to eliminate loss of heat exchange characteristics due to insufficient turbulence and velocity. Similarly, too small a cooling chamber is not desirable in order to avoid too great a pressure drop, a fouling problem and eliminate casting problems.

The cooling chamber preferably includes a center pin 21 which is larger than the other pins in the cooling chamber in order to provide additional strengthening and to enable the provision of a locater pin for semiconductor centering. Generally, the center pin has a diameter of from 0.25 to 0.5" and preferably from 0.325 to 0.425".

In accordance with the present invention, it is a finding of the present invention that the cooler is surprisingly efficient, inexpensive and simple to prepare. The fact that the cooler is a one-piece casting represents a considerable economic advantage. The metals which are employed in the cooler of the present invention will naturally depend on the environment of use and economic considerations. Preferably, copper, aluminum or alloys of these are employed.

Naturally, the embodiment shown in the drawings is illustrative only and many variations may be provided depending on the particular characteristics desired. Thus, as indicated hereinabove, wings 13 may be eliminated, the number of pins in the cooling chamber may be varied and the inlet and outlet placements may be altered. Also, the baffle means may be eliminated or modified or varied in location, if desired, and the shape of the cooler may naturally vary depending on the environment of use.

The advantages of the present invention will be more readily appreciated from a consideration of the following illustrative examples.

EXAMPLE I

A cooler having characteristics shown in the drawings was prepared in a one-piece copper casting. The cooler included the baffle 17 and contained 15 pins plus a center pin. The pin diameter was 0.25", the external upper and lower surfaces had a wall thickness of 0.125". The cooling chamber had a thickness of 0.37" and the pins were spaced 0.25" apart. The larger center pin had a diameter of 0.37".

The unit was tested for heat exchange characteristics at two independent facilities at flow rates varying from ½ gallon per minute to 4 gallons per minute utilizing a 1.75" pole face diameter semi-conductor. Heat exchange characteristics are given in °C. per watt. The lower the number, the more efficient the heat exchange characteristics. The results are shown in Table IA, below.

TABLE IA

| Flow Rate Gallons Per Minute | Facility No. 1 °C. Per Watt | Facility No. 2 °C. Per Watt |
| --- | --- | --- |
| .5 | .025 | .024 |
| 1 | .018 | 0.176 |
| 1.5 | .014 | — |
| 2 | .01 | .01 |
| 2.5 | .0086 | — |
| 3 | .0075 | .0077 |
| 3.5 | .0066 | — |
| 4 | — | .0062 |

These heat exchange characteristics are extremely good and represent a highly efficient heat sink. It should be noted that this heat will also accept up to a 2.5" pole face semi-conductor and will exhibit substantially increased heat transfer capability.

For comparison purposes, shown hereinbelow are published data for the heat exchange characteristics of two machined commercial heat sinks which are considered highly efficient (Table IB) and a commercially available cast heat sink which is also considered highly efficient (Table IC). The results clearly emphasize the advantages of the cooler of the present invention.

TABLE IB

| Flow Rate Gallons Per Minute | Sink No. 1 °C. Per Watt | Sink No. 2 °C. Per Watt |
| --- | --- | --- |
| .5 | .026 | .032 |
| 1 | .019 | .027 |
| 1.5 | .0145 | .023 |
| 2 | .012 | .021 |
| 2.5 | .01 | .019 |
| 3 | .0085 | .018 |

TABLE IC

| Flow Rate Gallons Per Minute | °C. Per Watt |
| --- | --- |
| .5 | .0255 |
| 1 | .019 |
| 1.5 | .015 |
| 2 | .0135 |
| 2.5 | .012 |
| 3 | .01 |
| 3.5 | .009 |

The improvement of the present invention is quite dramatic.

EXAMPLE II

The unit of the present invention of Example I (tested in Table IA) was tested for pressure drop and compared with the comparative units in Example I. Thus, the results showed that at a flow rate of 2 gallons per minute 1 psi pressure drop was obtained with straight fittings for the unit of the present invention compared with 2.2 psi for the machined unit and 0.25 psi for the cast unit. At 3 gallons per minute, the unit of the present invention showed a pressure drop of 2.2 psi with straight fittings compared with 4 psi for the machined unit (almost unusable) and compared with 1.2 psi for the cast unit.

Thus, the unit of the present invention is considerably better than the relatively efficient machined unit despite the fact that the unit of the present invention shows considerably higher heat transfer characteristics than the machined unit. The comparative cast unit shows good pressure drop characteristics; however, the heat transfer characteristics are quite poor.

Therefore, it can be readily seen that the high performance characteristics of the cooler of the present invention provides great versatility in the use thereof. For example, one can use straight fittings or 90° fittings, one can use a thinner unit, one can use a one-piece casting which is well suited for double sided cooling. Considerable variations in shapes and characteristics can readily be tolerated. Also, in view of the characteristics of the cooler of the present invention, one can clean same with a rod in an easy, convenient manner.

This invention may be embodied in other forms or carried out in other ways without departing from the spirit or essential characteristics thereof. The present invention is therefore to be considered as in all respects illustrative and not restrictive, the scope of the invention being indicated by the appended claims, and all changes which come within the meaning and range of equivalency are intended to be embraced therein.

What is claimed is:

1. A cooler for use with semi-conductor power elements which comprises: a one-piece metal casting having an essentially planar external surface and an internal cooling chamber for receiving a cooling medium, cooling medium inlet and outlet means communicating with said chamber for ingress and egress of cooling medium, and from 5 to 25 substantially round cooling pins within said chamber, wherein said pins are spaced 0.15 to 0.3" from each other and all of said pins have a diameter of from 0.15 to 0.5" to provide a tortuous path and turbulent flow for said cooling medium.

2. A cooler according to claim 1 having an essentially planar, external upper surface and an essentially planar external lower surface, with said chamber being located therebetween, wherein the distance within said chamber from said surface is from 0.25 to 0.4".

3. A cooler according to claim 2 wherein said upper and lower surfaces each have a wall thickness of from 0.1 to 0.150".

4. A cooler according to claim 1 wherein said pins have a diameter of from 0.15 to 0.30".

5. A cooler according to claim 4 including a larger center pin having a diameter of from 0.25 to 0.5".

6. A cooler according to claim 1 wherein the inlet and outlet are spaced from each other on the same side of said cooler.

7. A cooler according to claim 1 including baffle means inside said chamber.

8. A cooler according to claim 1 wherein said metal is selected from the group consisting of copper, aluminum and base alloys thereof.

9. A cooler according to claim 1 including means within said chamber to insure circulation of the cooling medium and to increase cooling medium turbulence.

* * * * *